United States Patent
Lamb et al.

(10) Patent No.: US 7,458,274 B2
(45) Date of Patent: Dec. 2, 2008

(54) PRESSURE SENSOR INCORPORATING A COMPLIANT PIN

(75) Inventors: Wayne A. Lamb, London, OH (US); Ryan S. Jones, Dublin, OH (US); Marsha M. Martin, Columbus, OH (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/708,851

(22) Filed: Feb. 20, 2007

(65) Prior Publication Data

US 2008/0196507 A1     Aug. 21, 2008

(51) Int. Cl.
*G01L 7/00*     (2006.01)
*H01R 12/00*     (2006.01)

(52) U.S. Cl. .......................... 73/756; 439/79

(58) Field of Classification Search .......... 73/700–756; 439/79, 620.15
See application file for complete search history.

(56) References Cited

U.S. PATENT DOCUMENTS

| | | | |
|---|---|---|---|
| 4,606,589 A | 8/1986 | Elsbree, Jr. et al. | 339/17 C |
| 4,857,018 A | 8/1989 | Pickles | 439/751 |
| 5,118,300 A * | 6/1992 | Zarreii | 439/79 |
| 5,122,064 A * | 6/1992 | Zarreii | 439/65 |
| 5,286,212 A * | 2/1994 | Broeksteeg | 439/108 |
| 5,342,211 A * | 8/1994 | Broeksteeg | 439/108 |
| 5,374,204 A | 12/1994 | Foley et al. | 439/751 |
| 5,587,535 A | 12/1996 | Sasaki et al. | 73/726 |
| 5,609,491 A * | 3/1997 | Cooper et al. | 439/79 |
| 6,042,393 A * | 3/2000 | Long | 439/79 |
| 6,050,842 A * | 4/2000 | Ferrill et al. | 439/404 |
| 6,260,268 B1 | 7/2001 | Gentry | 29/874 |
| 6,493,237 B1 | 12/2002 | Moody et al. | 361/760 |
| 6,565,367 B2 | 5/2003 | Budman et al. | 439/82 |
| 6,590,777 B2 | 7/2003 | Morino et al. | 361/736 |
| 6,623,280 B2 | 9/2003 | Oldenburg et al. | 439/75 |
| 6,719,573 B2 * | 4/2004 | Koehler et al. | 439/79 |
| 7,074,094 B2 | 7/2006 | Kawahara et al. | 439/751 |
| 7,131,334 B2 | 11/2006 | Mei | 73/715 |
| 2001/0046817 A1 | 11/2001 | Putnam | 439/751 |
| 2005/0269654 A1 | 12/2005 | Tanaka et al. | 257/415 |
| 2006/0059994 A1 | 3/2006 | Cameron et al. | 73/700 |
| 2006/0246786 A1 | 11/2006 | Noguchi | 439/751 |

\* cited by examiner

*Primary Examiner*—Andre J Allen
*Assistant Examiner*—Jermaine Jenkins
(74) *Attorney, Agent, or Firm*—Kermit D. Lopez; Luis M. Ortiz

(57) ABSTRACT

A method of incorporating compliant pins in a pressure sensor that uses PCB (printed circuit board) and is press fitted into the compliant pins. The compliant pins are made in the leadframe and the leadframes are molded into the plastic housing. The PCB is press fitted to the leadframe/housing assembly.

20 Claims, 4 Drawing Sheets

PRESSURE SENSOR INCORPORATING A COMPLIANT PIN

TECHNICAL FIELD

Embodiments are generally related to pressure sensors. Embodiments are also related to pressure sensor components. Embodiments are additionally related to compliant pins used in pressure sensors.

BACKGROUND OF THE INVENTION

Various sensors are known in the pressure sensing arts. Pressure sensors are commonly used in a wide variety of commercial and industrial applications. Such devices are employed because of their wide range pressure sensor operating applications and ability to operate in a variety of different environments. The pressure sensor operating environment, however, may place various operational constraints on the pressure sensor and its internal components Electrical contacts, otherwise referred to as terminals or contact pins, are used in the electronics industry in conjunction with PCB's (Printed Circuit Boards), electrical panels, connector cables and other devices, for making electrical connections to and from pressure sensors. As used herein, the terms "electrical" and "electronic", and conjugations thereof, are synonymous and interchangeable, and refer to any component, circuit, device or system, which utilizes the principles of electricity in its operation.

Compliant pins can include press-fit portions, which have certain elasticity. Such compliant pins are press-fitted into through-holes in a circuit board that possesses inner diameters slightly smaller than the outer diameters of the press-fit portions. When the pins are press-fitted into the through-holes, the press-fit portions closely contact (i.e., pressure contact) plated interior surfaces of the through-holes, while flexing in a direction perpendicular to an axial direction of the compliant pins. The compliant pins are then fixed to the circuit boards, and favorable electrical connections can be established between the compliant pins and circuits of the circuit board without soldering the contact portions therebetween. It is because situations occur in which forces are applied to the compliant pins in a direction of extraction that it is desirable that the contact pressure generated between the compliant pins and the through-holes be approximately 10 Newtons or greater in order to maintain an electrically stable connection. Such forces may be applied, for example, during the mounting and removal of electrical connectors or due to external factors.

Referring to FIG. 1, a side elevational view of a prior art compliant-based apparatus 100 is disclosed. A solid compliant connector contact 100 includes a guide portion 102, a contact portion 108, a first tapered portion 106 and a second tapered portion 110, all located generally adjacent one end of the contact. The first tapered portion 106 is disposed between the guide portion 102 and the contact portion 108 to facilitate movement of the contact portion into a hole (H) in a circuit board (CB).

The contact portion 108 and small parts of the tapered portions 106, 110 are formed to be compliant for holding the contact in electrical contact with the circuit board in the hole. The second tapered portion 110 is on the opposite (left) side of the contact portion 108 from the first tapered portion 106 and transitions to a mid-section 112 of the connector contact 100 having a larger diameter than the guide portion 102 for greater current carrying capacity and mechanical strength. The end of the contact 100 opposite the guide portion 102 is formed as a female connection portion (generally indicated at 118) having an axial socket 114 and slits 116 on diametrically opposite sides of the contact extending into the socket.

One of the problems with the prior art apparatus 100 is that compliant pins are used in electrical components, such as electrical connectors. When an electrical component is mounted onto a circuit board, the compliant pins simultaneously fix the electrical component to the circuit board and establish electrical connections between the electrical component and the circuit board. The prior art apparatus 100 does not adequately meet such requirements. Accordingly, it is desirable for the press-fit portions of the compliant pins to have a large holding force over long periods of time, which is a feature not adequately served by the prior art apparatus 100. It is also desirable that the force required to insert the compliant pins into the circuit board be low to facilitate mounting of the electrical component onto the circuit board. Because the compliant pins are formed from high strength materials and the press-fit portions are structured to generate great contact pressure with slight displacement, the circuit board must be formed from thick high strength materials in order to be able to withstand the contact pressure applied by the compliant pins. The diameters of the through-holes in the circuit boards are therefore limited to a narrow range, which is an additional problem encountered with the prior art apparatus 100.

Some pressure sensors use ceramics or printed circuit boards (PCB) to hold pressure sensing elements inside a package. This substrate needs to be connected to a leadframe for external connection. This connection is typically accomplished via soldering or wire bonding. These processes are expensive, difficult and a concern for failures in user applications.

Accordingly, a need exists for a new compliant pin in pressure sensor that relies on a force connection and does not require solder or wire bonding, and which overcomes the problems associated with the prior art apparatus 100.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved pressure sensor and method of forming the same.

It is another aspect of the present invention to provide for a compliant pin configuration for a pressure sensor.

The aforementioned aspects and other objectives and advantages can now be achieved as described herein. A method of incorporating a compliant pin in a pressure sensor and an apparatus thereof are disclosed. One or more leadframes can be molded into a plastic housing in order to provide a leadframe and housing assembly composed the leadframe(s) and said plastic housing. Additionally, one or more compliant pins can be configured in the leadframe(s). A PCB can then be press fitted to the leadframe and housing assembly via said compliant pin(s), such that the compliant pin provides a force connection for press fitting said printed circuit board to said leadframe, thereby providing a pressure sensor supported by the leadframe(s), the compliant pin(s), the printed circuit bard and said plastic housing. The leadframe (s) may be implemented as a metal leadframe.

The compliant pins thus rely on a force connection and do not require solder or wire bonding. The PCB can be press fitted to the leadframe/housing assembly. The housing itself can be made without special tooling or modifications. The processes and techniques for providing a pressure sensor in this manner are therefore less expensive and relatively easy to implement when used or incorporated in the context of different pressure sensing environments.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
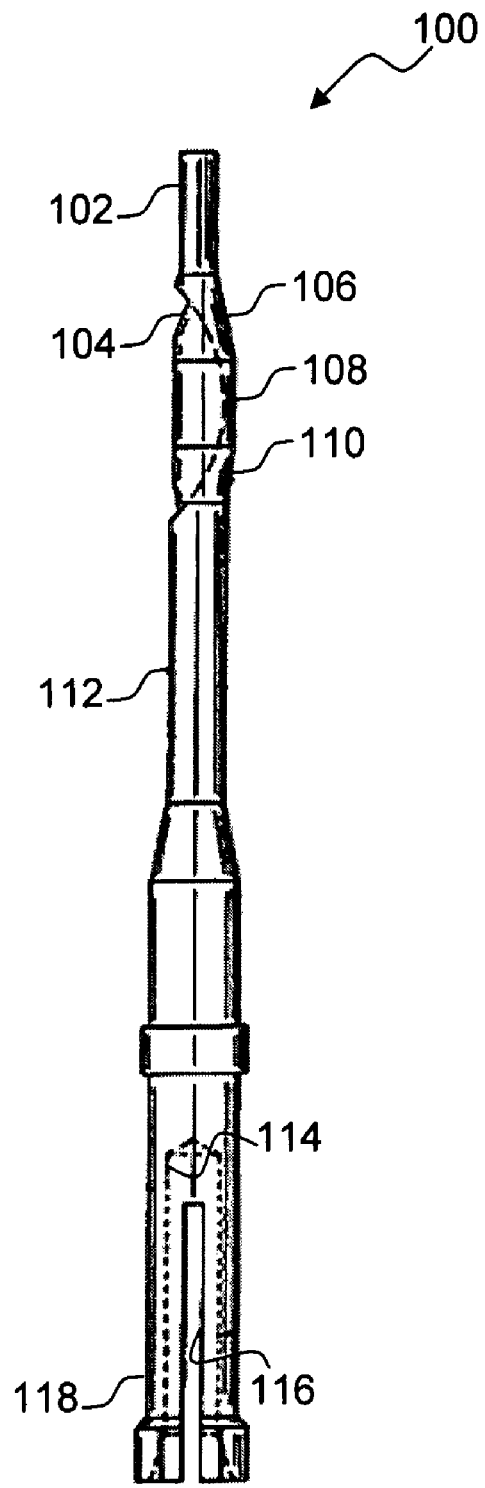
FIG. 1 illustrates a side view of a prior art pressure sensor including a solid compliant pin connector contact.
Figure 2:
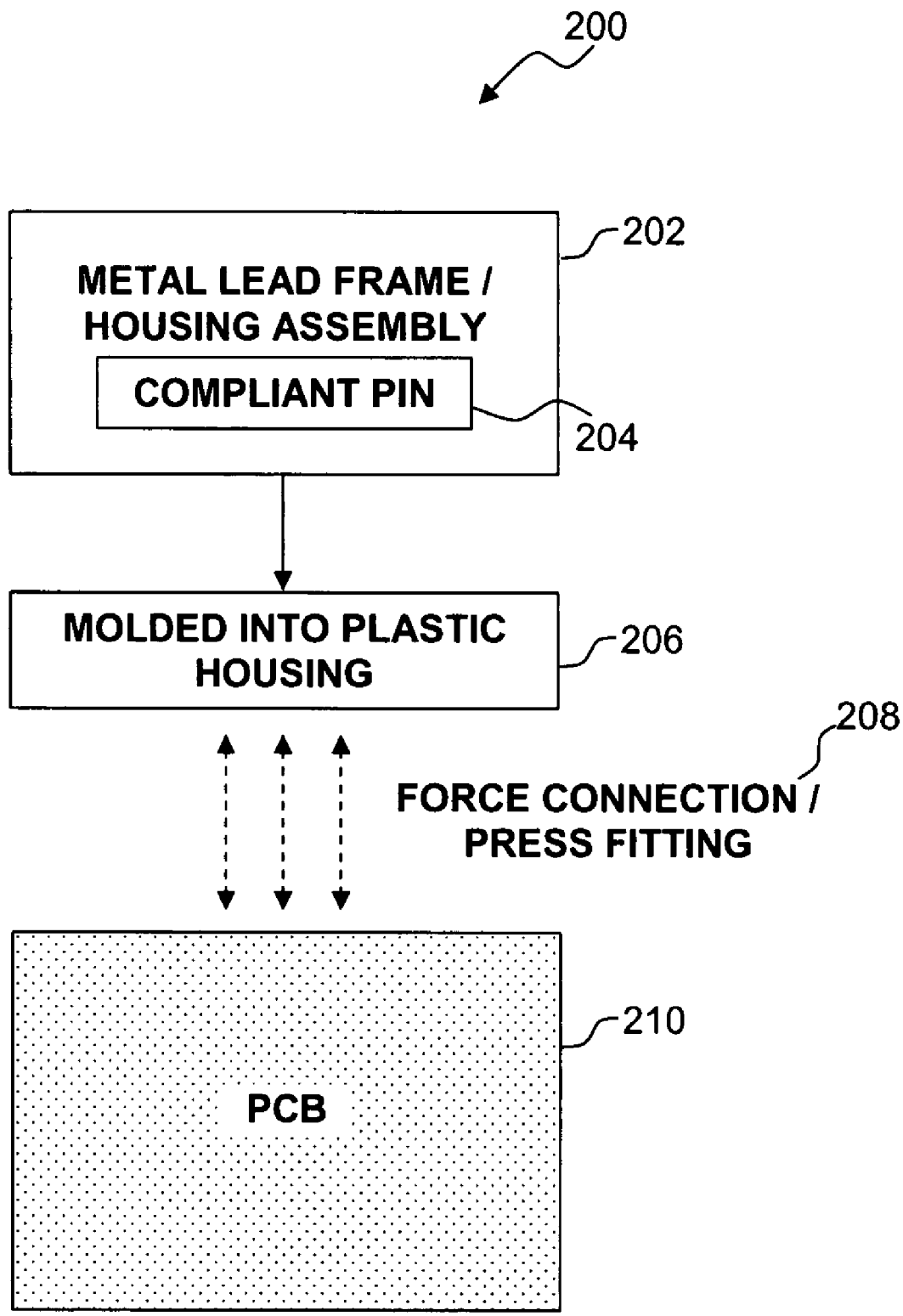
FIG. 2 illustrates a block diagram of a pressure sensor, which can be implemented in accordance with a preferred embodiment.

Referring now to the drawings and in particular to FIG. 2, a block diagram of a pressure sensor 200 is illustrated, which can be implemented in accordance with a preferred embodiment. The pressure sensor 200 includes one or more compliant pins 204 that can be configured and located in a metal leadframe/housing assembly 202, and which can be molded into a plastic housing 206. The plastic housing 206 and the leadframe 202 together form a leadframe/housing assembly 202. Note that a single leadframe/housing assembly or multiple leadframes may be utilized, depending upon design considerations. Similarly, a single compliant pin 204 can be utilized or multiple compliant pins. A PCB (Printed Circuit Board) 210 can be force connected and/or press fitted 208 to a leadframe/housing assembly 202.

The compliant pins 204 can rely on a force connection by utilizing the pins formed with tabs or another irregular structural formation in the pin portion and then being captured into the molded body portion. The manner of using a pin with dual compliant portions for establishing an interconnection between two printed circuit boards as taught by prior art devices is also being avoided utilizing the configuration described herein. The tapered portions 106, 110 and the contact portions 108 for the electrical contacts are avoided because the connection is based on force connection 208 by utilizing a PCB 210 and a metal leadframe 202.

Figure 3:
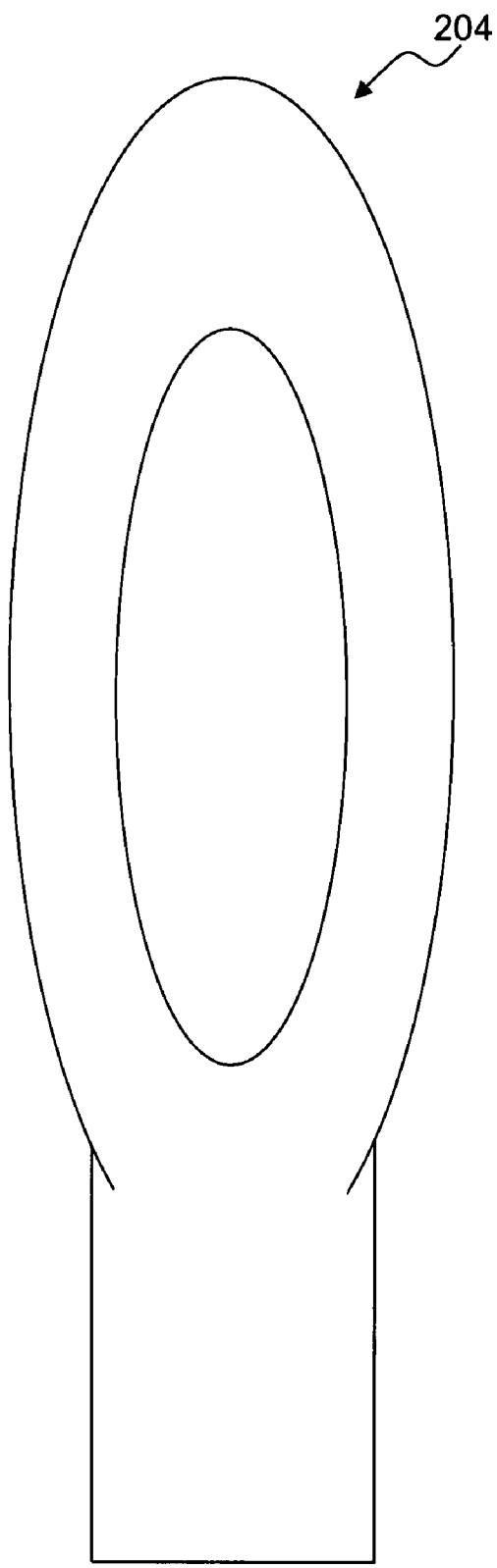
FIG. 3 illustrates a side view of a compliant pin, which can be implemented in accordance with a preferred embodiment.

FIG. 3 illustrates a side view of a compliant pin 204, which can be implemented in accordance with a preferred embodiment. The compliant pin(s) 204 depicted in FIG. 3 represents the same compliant pin 204 described above with respect to FIG. 2. The compliant pin(s) 204 relies on a force connection and does not require solder or wire-bonding. The compliant pin(s) 204 utilizes the PCB 210 and the metal leadframe 202. The PCB 210 can be press fitted to the compliant pin(s) 204.

Figure 4:
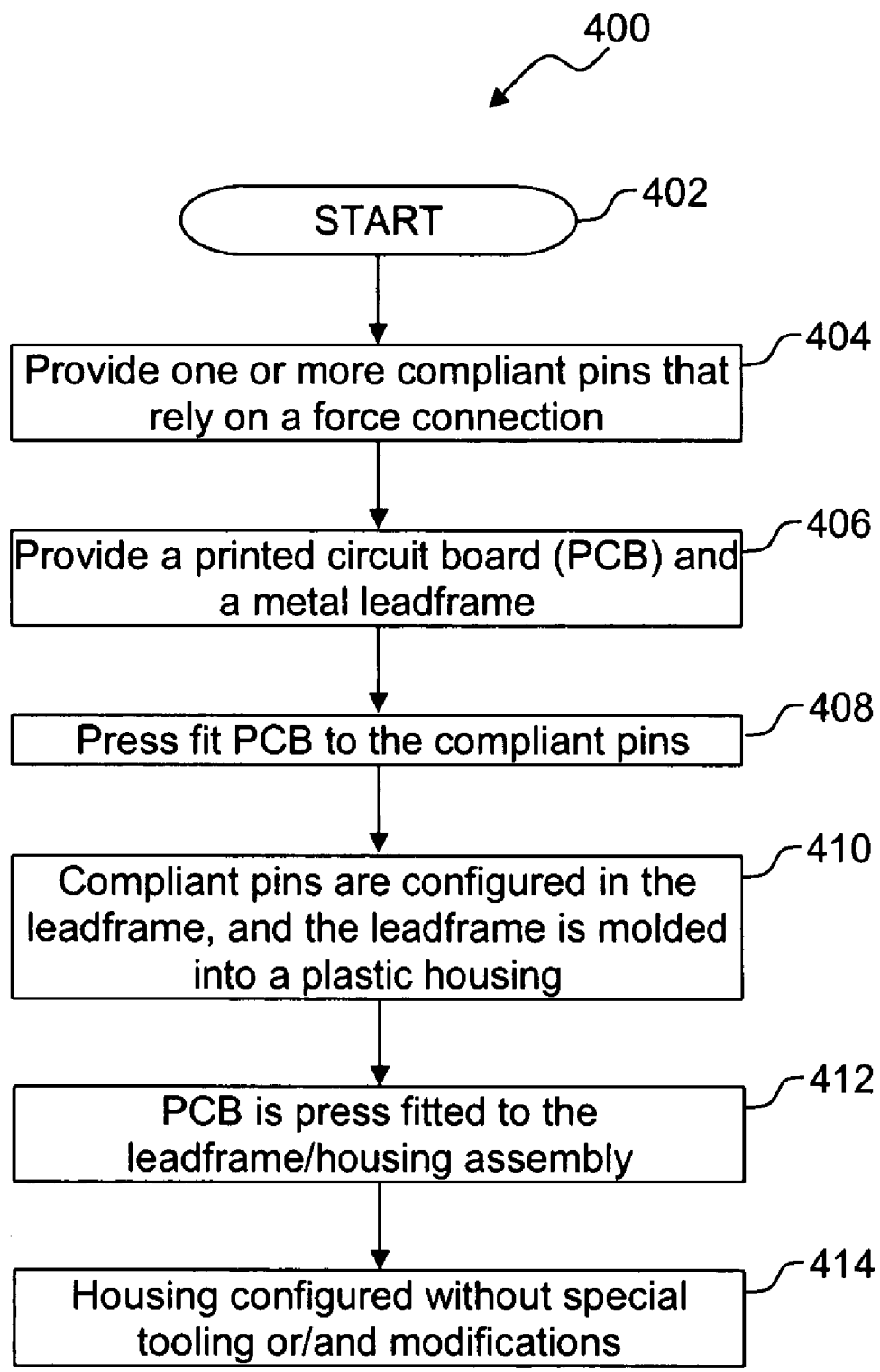
FIG. 4 illustrates a high-level flow of chart of operations depicting a method for forming compliant pin in a pressure sensor, in accordance with a preferred embodiment.

FIG. 4 illustrates a high-level flow of chart of operations of method 400 for forming a compliant pin in pressure sensor, in accordance with a preferred embodiment. The process begins, as depicted at block 402. Next, as indicated at block 404, compliant pin(s) 204 rely on a force connection. Thereafter, as described at block 406 the printed circuit board (PCB) 210 and the metal leadframe 202 can be utilized. Next as depicted at block 408, PCB 210 can be press fitted to the compliant pin(s) 204. Thereafter, as described at block 410, compliant pin(s) 204 are configured in the leadframe 202, and the leadframe 202 can be molded into the plastic housing. Next as depicted at block 412, PCB can be press fitted to the leadframe/housing assembly composed of the plastic housing 206 and one or more leadframes 202. Finally, as indicated at block 414, the housing 206 can be configured without special tooling or/and modifications.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method of incorporating a compliant pin in a pressure sensor, comprising:
   molding at least one leadframe into a plastic housing in order to provide a leadframe and housing assembly composed of said at least one leadframe and said plastic housing;
   configuring at least one compliant pin in said at least one leadframe;
   connecting a printed circuit board to said leadframe and housing assembly via said at least one compliant pin, such that said at least one compliant pin provides a force connection for press fitting said printed circuit board to said leadframe wherein said force connection is achieved by utilizing said at least one compliant pin formed with a tab in the pin portion which is captured in the molded body portion, thereby providing a pressure sensor supported by said at least one leadframe, said at least compliant pin, said printed circuit bard and said plastic housing.

2. The method of claim 1 wherein said at least one leadframe comprises a metal leadframe.

3. The method of claim 1 wherein connecting said printed circuit board to said leadframe and housing assembly via said at least one compliant pin further comprises press fitting said printed circuit board to said leadframe and housing assembly.

4. The method of claim 1 wherein connecting said printed circuit board to said leadframe and housing assembly via said at least one compliant pin further comprises force connecting said printed circuit board to said leadframe and housing assembly.

5. The method of claim 1 wherein said at least one leadframe comprises a metal leadframe and wherein connecting said printed circuit board to said leadframe and housing assembly via said at least one compliant pin further comprises press fitting said printed circuit board to said leadframe and housing assembly.

6. The method of claim 1 wherein said at least one leadframe comprises a metal leadframe and wherein connecting said printed circuit board to said leadframe and housing assembly via said at least one compliant pin further comprises force connecting said printed circuit board to said leadframe and housing assembly.

7. The method of claim 1 wherein said at least one leadframe comprises a metal leadframe and wherein connecting said printed circuit board to said leadframe and housing assembly via said at least one compliant pin further comprises press fitting said printed circuit board to said leadframe and housing assembly.

8. The method of claim 1 wherein said at least one leadframe comprises a metal leadframe and wherein connecting said printed circuit board to said leadframe and housing assembly via said at least one compliant pin further comprises force connecting said printed circuit board to said leadframe and housing assembly.

9. A method of incorporating a compliant pin in a pressure sensor, comprising:
molding at least one leadframe into a plastic housing in order to provide a leadframe and housing assembly composed of said at least one leadframe and said plastic housing, wherein said at least one leadframe comprises a metal leadframe;
configuring at least one compliant pin in said at least one leadframe;
connecting a printed circuit board to said leadframe and housing assembly via said at least one compliant pin, such that said at least one compliant pin provides a force connection for press fitting said printed circuit board to said leadframe wherein said force connection is achieved by utilizing said at least one compliant pin formed with a tab in the pin portion which is captured in the molded body portion, thereby providing a pressure sensor supported by said at least one leadframe, said at least compliant pin, said printed circuit bard and said plastic housing.

10. The method of claim 9 wherein connecting said printed circuit board to said leadframe and housing assembly via said at least one compliant pin further comprises press fitting said printed circuit board to said leadframe and housing assembly.

11. The method of claim 9 wherein connecting said printed circuit board to said leadframe and housing assembly via said at least one compliant pin further comprises force connecting said printed circuit board to said leadframe and housing assembly.

12. A pressure sensor apparatus, comprising:
at least one leadframe molded into a plastic housing in order to provide a leadframe and housing assembly composed of said at least one leadframe and said plastic housing;
at least one compliant pin configured in said at least one leadframe;
a printed circuit board connected to said leadframe and housing assembly via said at least one compliant pin, such that said at least one compliant pin provides a force connection for press fitting said printed circuit board to said leadframe wherein said force connection is achieved by utilizing said at least one compliant pin formed with a tab in the pin portion which is captured in the molded body portion, thereby providing a pressure sensor supported by said at least one leadframe, said at least compliant pin, said printed circuit bard and said plastic housing.

13. The apparatus of claim 12 wherein said at least one leadframe comprises a metal leadframe.

14. The apparatus of claim 12 wherein said printed circuit board is press fitted to said leadframe and housing assembly.

15. The apparatus of claim 12 wherein said printed circuit board is force connected to said leadframe and housing assembly.

16. The apparatus of claim 12 wherein said at least one leadframe comprises a metal leadframe and wherein connecting said printed circuit board to said leadframe and housing assembly via said at least one compliant pin further comprises press fitting said printed circuit board to said leadframe and housing assembly.

17. The apparatus of claim 12 wherein said at least one leadframe comprises a metal leadframe and wherein connecting said printed circuit board to said leadframe and housing assembly via said at least one compliant pin further comprises force connecting said printed circuit board to said leadframe and housing assembly.

18. A pressure sensor apparatus, comprising:
at least one leadframe;
a plastic housing, wherein said at least one leadframe is molded into said plastic housing in order to provide a leadframe and housing assembly composed of said at least one leadframe and said plastic housing, said at least one leadframe comprising a metal leadframe;
at least one compliant pin configured in said at least one leadframe; and
a printed circuit board connected to said leadframe and housing assembly via said at least one compliant pin, such that said at least one compliant pin provides a force connection for press fitting said printed circuit board to said leadframe wherein said force connection is achieved by utilizing said at least one compliant pin formed with a tab in the pin portion which is captured in the molded body portion, thereby providing a pressure sensor supported by said at least one leadframe, said at least compliant pin, said printed circuit bard and said plastic housing.

19. The apparatus of claim 18 wherein said printed circuit board is press fitted to said leadframe and housing assembly.

20. The apparatus of claim 18 wherein said printed circuit board is force connected to said leadframe and housing assembly.

* * * * *